United States Patent [19]
Young et al.

[11] Patent Number: 5,965,933
[45] Date of Patent: Oct. 12, 1999

[54] SEMICONDUCTOR PACKAGING APPARATUS

[76] Inventors: William R. Young, 1532 Breezewood La. N.W., Palm Bay, Fla. 32907; Kenneth A. Ports, 3067 N. Rio Pino Dr., Indialantic, Fla. 32903

[21] Appl. No.: 08/654,316

[22] Filed: May 28, 1996

[51] Int. Cl.[6] .................................................. H01L 29/40
[52] U.S. Cl. ......................... 257/621; 257/684; 257/774; 257/777
[58] Field of Search .................... 257/621, 684, 257/777, 778, 774

[56] References Cited

U.S. PATENT DOCUMENTS

| | | | |
|---|---|---|---|
| 4,232,326 | 11/1980 | Neidig et al. | 257/684 |
| 5,202,754 | 4/1993 | Bertin et al. | 257/684 |
| 5,481,133 | 1/1996 | Hsu | 257/777 |

*Primary Examiner*—Peter Toby Brown
*Assistant Examiner*—Roy Potter
*Attorney, Agent, or Firm*—Jaeckle Fleischmann & Mugel, LLP

[57] ABSTRACT

Semiconductor devices 340 are formed in semiconductor wafer 300. Contact pads 332 are formed in each die 330. An interconnect connects the contact pads 332 to die surface contact regions 210, 212. Scribe trenches 348 are formed in device wafer 300; corresponding trenches 358 are formed in cover wafer 360. The cover wafer 360 is thinned to open scribe trenches 348. Conductive vias 310–313 connect the contact pads 210, 212 to external surface bump contacts 333.

17 Claims, 3 Drawing Sheets

SEMICONDUCTOR PACKAGING APPARATUS

FIELD OF THE INVENTION

The present invention relates to semiconductor device structures and methods for packaging such structures at the wafer level without requiring plastic encapsulation or enclosure in ceramic packages after the individual semiconductor devices (also known as dice) are formed.

The invention is especially suitable for sealing and protecting microelectronic devices, such as semiconductor devices and other components, including interconnecting conductors, air bridges, inductors or capacitors, against damage or contamination from outside the device.

The invention provides a packaged die of substantially the same volume as an unpackaged, conventionally fabricated die.

BACKGROUND OF THE INVENTION

The packaging of semiconductor devices is conventionally carried out, whether in plastic or in ceramic packages, after the active circuit elements have been formed by semiconductor device processing. Individual circuits or groups of circuits are broken into so-called dice. The dice are then attached to lead frames. Bond pads on each die are bonded to the leads of the lead frame and the wired bonded lead frame and die are packaged. Such individual handling of dice in the fabrication of the devices is labor-intensive and thus undesirable.

High speed semiconductor devices often use air bridges to decrease the capacitance between metal lines and the silicon substrate. Air is an excellent dielectric and it is desirable to dispose air bridges between metal lines carrying high speed signals and the substrate.

While semiconductor devices are very small devices, miniaturization thereof is desirable but is adversely affected by the need to package the devices in a way that will protect them from damage or contamination. While encapsulation in plastic or ceramic provides suitable protection and isolation from contamination, the plastic or ceramic package is often many times the size of the semiconductor device and limits miniaturization thereof. In addition, plastic encapsulation may fill voids in the device, particularly voids that are provided for air bridges. The filling of these voids with plastic, which has a dielectric constant greater than air, increases the parasitic capacitance of the device and reduces its high frequency response limiting the speed at which signals can propagate in the device. Similar limitations exist where other devices, such as micromachines or machinable components, are needed.

SUMMARY OF THE INVENTION

The invention overcomes the disadvantages of the prior art by providing a packaged semiconductor device that dispenses with the requirement for conventional external die packages. The invention provides a device wafer with a plurality of device dice. A microelectronic structure, a micromachine, or a machinable component is formed in each device die. The device has contact pads to connect the device to external circuits and to power sources. Interconnects electrically connect surface contact regions of the device to the contact pads. A cover wafer is bonded to the device wafer. Vias extend from the outer surface of the device wafer, or the cover wafer, or both to the contact pads. In one embodiment, the vias terminate with bump contacts for connecting other devices or power sources to the packaged semiconductor device.

All processing is performed at the wafer level, including packaging, die identification, and testing. Semiconductor devices are formed in dice of a wafer of semiconductor material, such as silicon, germanium, silicon germanium, silicon carbide, gallium arsenide, or any other semiconductor known to those skilled in the art. The devices in the dice have surface contact regions for receiving interconnects to external devices and power supplies. Contact pads are formed within the dice and scribe trenches are formed between dice. Suitable interconnects are formed between surface contact regions of the dice and the contact pads. A cover wafer is bonded to the device wafer. The device wafer is thinned to open the scribe trench. The device wafer, the cover wafer, or both are processed to form vias to an outside surface of at least one of the cover or device wafers. Contact bumps are formed on the vias. The covered dice are inscribed with die identification indicia by a marking system. The covered die are electrically tested before they are separated from each other. The dice are separated from each other by thinning or scribing.

DETAILED DESCRIPTION

Figure 1:
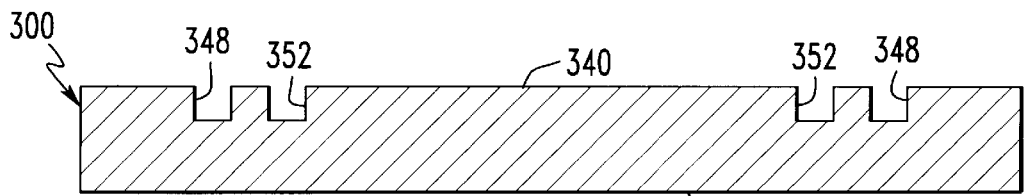
FIG. 1 is a cross sectional view of a device wafer with a scribe trenches and contact cavities.

With reference to FIG. 1, device die 330 of silicon wafer 300 is shown. The die 330 has a plurality of contact cavities 352 that are distributed about the periphery of a device area 340. Device area 340 will be processed to form one or more microelectronic structures including but not limited to transistors, resistors, diodes, capacitors, and inductors. The device area 340 may also be processed to form a micromachine, such as a deformable mirror device, or a machinable component. Scribe trenches 348 are disposed spaced from the cavities 352. The depth of the scribe trench 348 and the depth of the cavity 352 will determine the final thickness of the device substrate 330. The depth of the cavities 352 is greater than the depth of the devices formed in device substrate 330. The scribe trenches 348 and cavities 352 are formed by masking the device wafer 300 with photoresist, patterning the resist to selectively expose the device substrate, and etching the trenches 348 and cavities 352.

Figure 2:
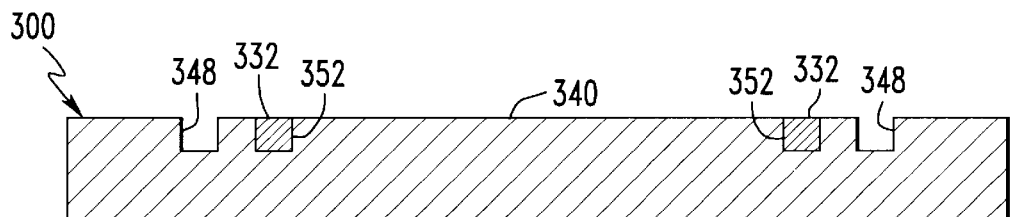
FIG. 2 is cross sectional view showing the contact cavity filled with a metal.

Next, the surface of device wafer 300 is masked and a layer of metal, preferably a refractory metal, is deposited in cavities 352 to form conductive vias pads 332, as shown in FIG. 2. It is preferable to use a refractory metal such as titanium or titanium tungsten, or a silicide because the substrate 330 will be heated to high temperatures during further processing.

Figure 3:
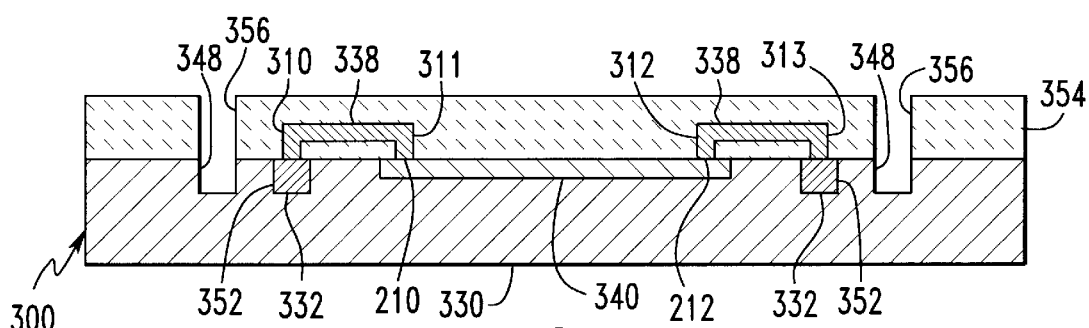
FIG. 3 is a cross sectional view showing a dielectric layer with interconnects extending from contact pads on the semiconductor device to devices in the device wafer.

The intermediate structure shown in FIG. 2, is further processed to form at least one cavity 339 for a semiconductor device 340 as shown in FIG. 3. Details of the formation of the semiconductor device are not provided. However, any suitable process including any suitable metal oxide semiconductor process, or bipolar process or BICMOS process may be used to form the semiconductor device 340. The semiconductor device 340 has one or more surface contact regions 210, 212. These surface contact regions connect the semiconductor device 340 to interconnect metal 338. A dielectric layer 354 of suitable material, including but not limited to silicon dioxide or silicon nitride, is formed over the semiconductor device 340. The dielectric layer 354 has contact pads 310–313 connecting the surface contact regions 210, 212 and the conductive vias 332 to the contact pads 310 and 313 and interconnect metal 338. For example, openings for contacts are made in the dielectric layer 354. A metal, such as aluminum is deposited over the layer 354 to fill the contact openings. The deposited metal layer is patterned with photoresist and etched to form the interconnect metal layer 338. The thickness of dielectric layer 354 is increased to cover and enclose the interconnect metal 358. Dielectric layer 354 is further processed to provide further openings 356 aligned with scribe trenches 348.

Figure 4:
FIG. 4 is a cross sectional view of a cover wafer.

Turning to FIG. 4, a cover wafer 360, typically formed of semiconductor material such as silicon, is provided with scribe trenches 358 that correspond to the scribe trenches of 348 of device substrate 330.

Figure 5:
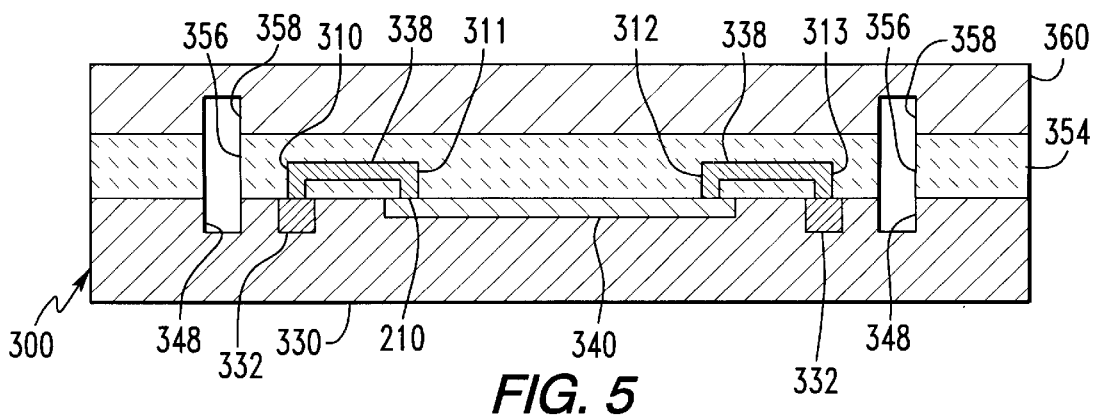
FIG. 5 is a cross sectional view of the bonded cover and device wafer.
Figure 6:
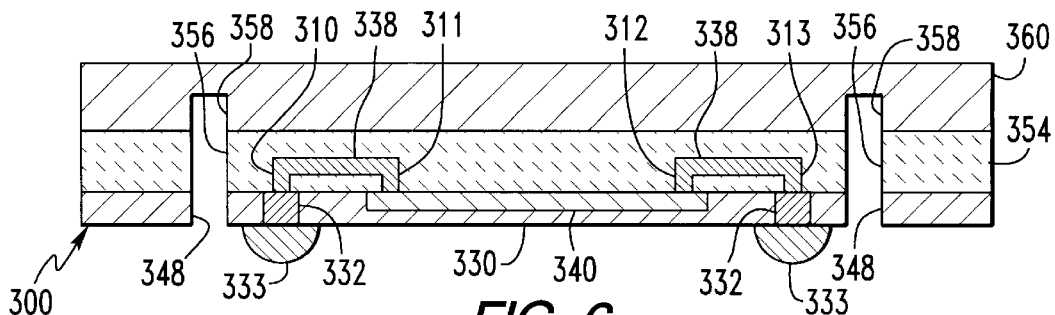
FIG. 6 is a cross sectional view showing contact bumps and partial openings in the scribe trenches.
Figure 7:
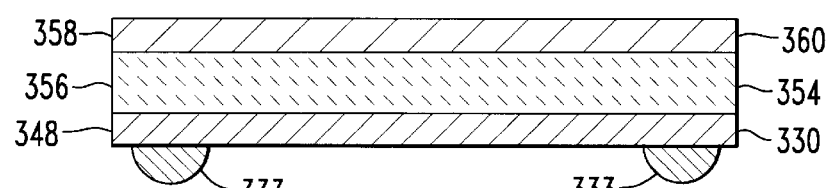
FIG. 7 is a completed device with contact bumps on the device wafer.

With reference to FIG. 5, cover wafer 360 is bonded to the device wafer 300 with known bonding techniques. As such, the inner surface of the cover substrate 360 is bonded to dielectric layer 354 of device wafer 300. The outer surfaces of both the device wafer 300 and the cover wafer 360 are available for further processing. As shown in FIG. 6, the device wafer 300 is thinned by removing a portion of the device substrate material from the outer surface in order to expose the refractory metal 332 and the scribe trenches 348. The dice of wafer 300 are suitably marked with indicia to indicate, for example: manufacturer and type of device. A suitable marking method may be used, including but not limited to a laser marking tool or masking and etching, implanting or oxidizing that inscribes indicia, including but not limited to alpha-numeric characters, which are visible from the outer surface of each packaged die. The exposed conductive vias 332 are treated with a customary bump process in order to form bump contacts 333 on the conductive vias 332. The cover wafer 360 is either further thinned or scribed to separate the dice 330 in device wafer 300 from each other in order to provide the finished device as shown in FIG. 7.

Figure 8:
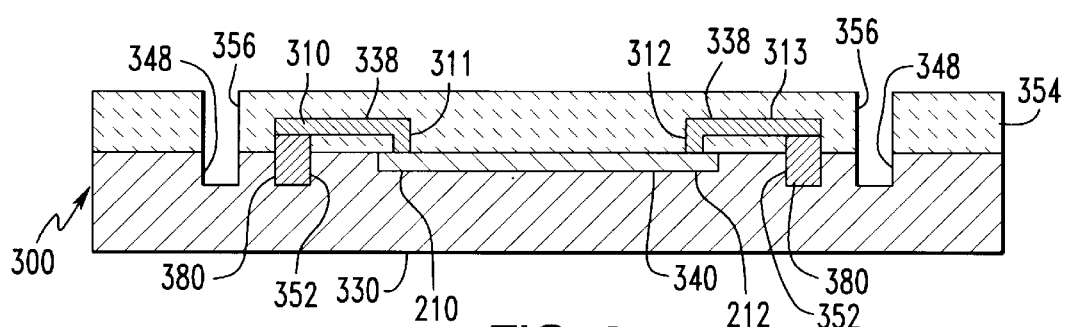
FIG. 8 shows an intermediate cross section of a second embodiment.

FIG. 8 illustrates a second embodiment of the processing shown in FIG. 3. The structure shown in FIG. 8 does not require refractory metal for conductive vias 332. Instead, the scribe trenches 348 and the cavities 352 are formed after the device 340 is completed. A metal or silicide is formed in cavities 352 in order to form conductive vias 380. Dielectric layer 354 is suitably patterned to provide openings to contact pad 331 and surface contact regions 210, 212. Next, a layer of metal is deposited over dielectric 354 to fill the openings. The metal layer is suitably patterned into interconnect 338. The thickness of the dielectric layer 354 is increased to enclose the interconnect 338. Dielectric layer 354 is further patterned and etched to provide scribe trenches 356. The intermediate structure shown in FIG. 8 is further processed to provide the device shown in FIG. 7.

Figure 9:
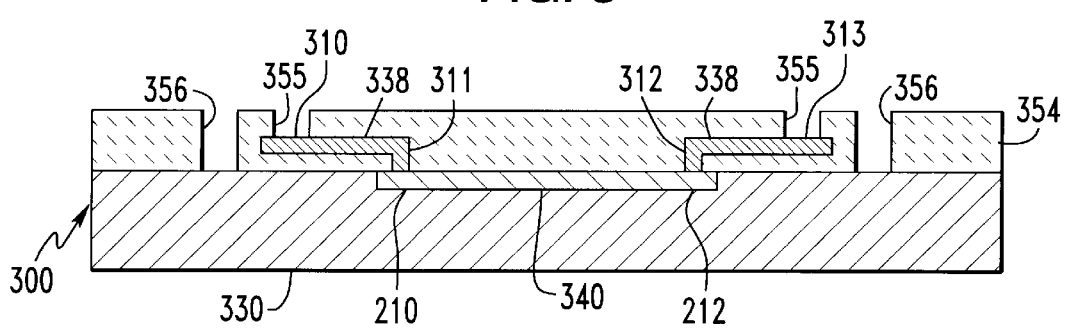
FIG. 9 is a third embodiment suitable for forming contact bumps on the cover wafer.
Figure 10:
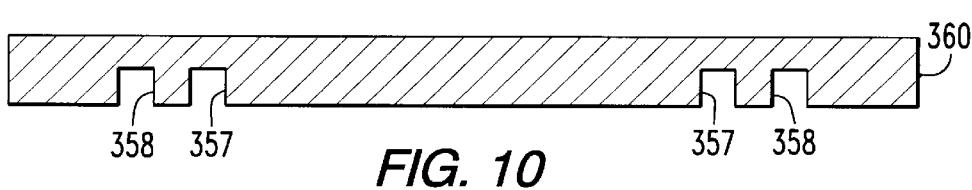
FIG. 10 is a cross section of a cover wafer.
Figure 11:
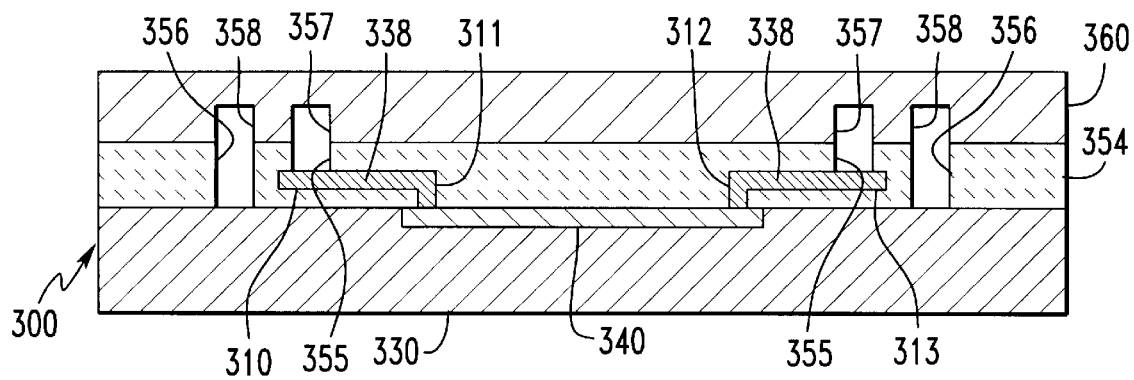
FIG. 11 is a cross section of a cover wafer of FIG. 10 bonded to the device wafer of FIG. 9.
Figure 12:
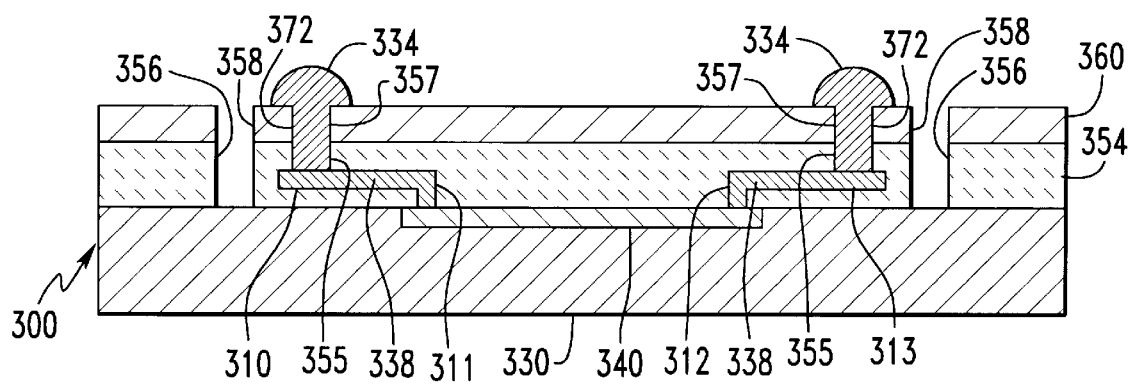
FIG. 12 shows a cross section of the cover with contact bumps and scribe trenches formed in the structure of FIG. 1.
Figure 13:
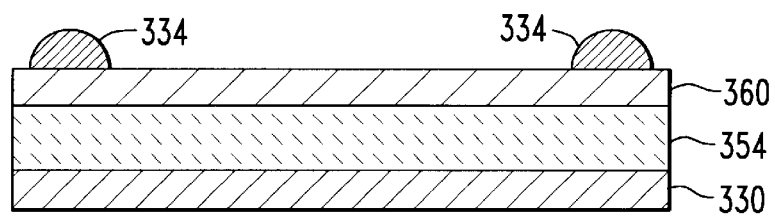
FIG. 13 shows the separated die with contact bumps on the cover wafer.

FIG. 9 shows an intermediate stage in manufacturing a top bump contact device. There the dielectric layer 354 is formed over the device wafer 300. Openings to surface contact regions 210, 212 are made in dielectric 354. Metal is deposited over layer 354 and in the openings to surface contact regions 210, 212. The layer of metal is suitably patterned to form interconnects 338 and contact pads 310–313. The dielectric layer 354 thickness is increased to enclose interconnects 338. After the interconnects 338 are encased in dielectric, further openings 355 and 356 are made in the dielectric. Openings 356 are scribe openings; openings 355 expose the contact pads 310 and 313 on the interconnect 338. As shown in FIG. 10, a cover substrate 360 having scribe trenches 358 and contact holes 357 is suitably bonded to the intermediate structure of FIG. 9 to provide the intermediate structure shown in FIG. 11. Next, cover wafer 360 is thinned to open scribe trenches 358 and holes 357 to interconnect 338. The via holes 355, 357 to interconnect 338 are filled with metal 372, and bump contacts 334 are formed on the outer surface of the cover substrate 360 as shown in FIG. 12. In a manner well known in the art, the die 330 is separated from adjacent devices with a saw or laser or diamond scribing tool or by etching wafer 300 in order to provide the structure shown in FIG. 13.

Figure 14:
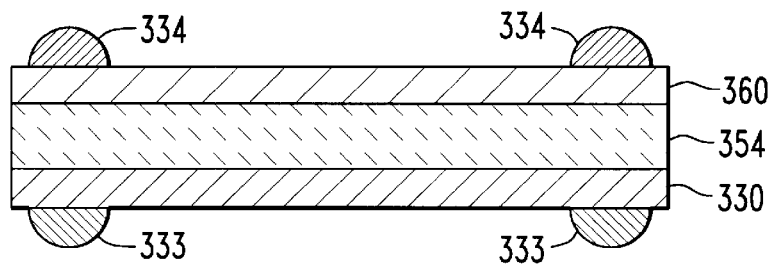
FIG. 14 shows separated die with contact bumps on the cover wafer and the device wafer.

Those skilled in the art will appreciate that following a combination of the techniques shown above one may process an semiconductor device 340 to provide the packaged integrate circuit shown in FIG. 14. That device has bump contacts on the outer surface of the cover substrate 360 and on the device substrate 330. A plurality of devices of the type shown in FIG. 14 may be stacked to provide a module where interconnections are made both via the top and bottom surfaces through the respective bump pads 333 and 334, thereby providing a miniature module containing a plurality of semiconductor devices.

The advantages that are obtained in the various embodiments of the invention may be one or more of the following: (1) a die containing an semiconductor device that is thin for rapid heat flow; (2) metal point or bump interconnections which permit smaller die areas than tab bonding as well as better thermal and electrical transmission properties than tabs; (3) all processing before separation into dice may be carried out at the wafer level; (4) chemical thinning and separation of wafers and dice may be used if desired; (5) polymers such as PMMA or similar organic compounds and other low temperature plastic bonding materials may be used to bond the wafers into packaged assemblies providing the semiconductor devices; (6) the dice (the final devices) need not be rectilinear but may be of other shapes and/or have rounded corners; (7) dice may be identified by etching into the top or bottom surfaces of the substrates before separation; (8) package level contact pads are accessible at the wafer level to enable wafer level burn-in of the semiconductor devices and final test thereof while still in wafer form thereby eliminating final package tests; (9) a conventional scribe and break process provides the final package assembly; (10) individual die mounting, bonding, encapsulation and branding may be eliminated; (11) the wafers and the dice may be handled by automatic robotic machinery; (12) since the dice are handled at the wafer level, mechanically induced defects are eliminated (for example chips hitting each other cause edges to be knocked off), improving the yield in the number of packaged die per batch over yields needing conventional die handling and packaging; (13) the final encapsulated die has the same volume as the unencapsulated die.

The above description shows a method and package for encapsulating a semiconductor device. Those skilled in the art will understand that the invention can package or encapsulate other devices, including air bridges. For an air bridge, a cavity is formed in the surface of the device wafer and air bridge conductors transit the cavity. The cavity may contain other devices, including but not limited to resonant beams, photodetectors, surface acoustic wave devices, moveable mirror devices, and other micromachines. So, air bridges, micromachines, and other structures and techniques shown in co-pending U.S. patent application Ser. Nos. 08/658,010, 08/650,762, 08/705,536, and 08/650,688 (all pending) assigned to the same assignee as this invention, are herein incorporated by reference. The cover wafer of the invention may be made of semiconductor material or any other material suitable for processing and packaging. In addition, the cover wafer may be transparent 361 or opaque 362 to light. A transparent cover wafer is preferred for photodetector devices and other devices such as erasable programmable read only memory (eprom) devices that are erased by exposing the memory device to ultraviolet radiation. If the cover wafer is made of silicon, it can be rendered transparent by oxidizing the cover wafer to convert the silicon into transparent silicon dioxide.

From the foregoing description it will be apparent that there has been provided improved semiconductor devices and methods of making the same, while several embodiments that obtain the features of the invention have been described; variations and modifications thereof within the scope of the invention will undoubtedly become apparent to those skilled in the art. The foregoing description should be taken as illustrative and not in a limiting sense.

We claim:

1. A packaged semiconductor device comprising:
   a device die of semiconductor material having an inner surface and an outer surface, said inner surface having one or more semiconductor devices formed in the inner surface, said devices having one or more surface contact regions;
   an interconnect structure for connecting first and second contact pads, the first contact pad contacting the surface contact region in the surface of the device die and the second contact pad contacting a conductive via;
   a cover die having an inner surface and an outer surface with its inner surface bonded to the device die to cover the semiconductor devices;
   a conductive via extending from the outer surface of at least one of the device die and the cover die to the second contact pad and terminating on the second contact pad without penetrating through said second contact pad; and
   an external contact on the outer end of the conductive via for establishing a continuous conductive path from the external contact to the surface contact region.

2. The packaged semiconductor device of claim 1 further comprising a dielectric layer formed over the inner surface of the device die, said dielectric layer including said interconnect.

3. The packaged semiconductor device of claim 1 wherein the external contact further comprises a bump contact raised from said outer surface.

4. The packaged semiconductor device of claim 1 wherein the via extends to the outer surface of the device die.

5. The packaged semiconductor device of claim 1 wherein the via extends to the outer surface of the device die and the outer surface of the cover die.

6. The packaged semiconductor device of claim 1 wherein device die is one semiconductor material selected from the group consisting of silicon, germanium, silicon germanium, silicon carbide, and gallium arsenide.

7. The packaged semiconductor device of claim 1 wherein said cover die is one selected from the group consisting of silicon, germanium, silicon germanium, silicon carbide, and gallium arsenide.

8. The packaged semiconductor device of claim 1 wherein said device die comprises a cavity.

9. The packaged semiconductor device of claim 1 wherein said cover die is opaque.

10. The package semiconductor device of claim 1 wherein said cover die is transparent to visible and ultraviolet light.

11. The package semiconductor device of claim 1 wherein said cover die comprises transparent regions to visible and ultraviolet light and opaque regions.

12. The packaged semiconductor device of claim 1 wherein said device die comprises a cavity and a device is disposed in said cavity.

13. The packaged semiconductor device of claim 1 wherein the via extends to the outer surface of the cover die.

14. A packaged semiconductor device comprising:
    a device die of semiconductor material having an inner surface and an outer surface, said inner surface having one or more semiconductor devices formed in the inner surface, said device(s) having one or more surface contact regions;
    an interconnect structure for electrically connecting two or more contact pads; a first contact pad contacting the surface contact region in the surface of the device die and a second contact pad having a planar surface substantially parallel to the device die for contacting a conductive via said interconnect structure connecting said two pads;
    a cover die having an inner surface and an outer surface with its inner surface bonded to the device die to cover the semiconductor devices;
    a conductive via extending from the outer surface of at least one of the device die and cover die to the second contact pad and terminating transversely on the planar surface of the second contact pad without penetrating through said second contact pad; and
    an external contact on the outer end of the conductive via for establishing a continuous conductive path from the external contact to the surface contact region.

15. The packaged semiconductor device of claim 14 wherein the via extends to the outer surface of the device die.

16. The packaged semiconductor device of claim 14 wherein the via extends to the outer surface of the cover die.

17. The packaged semiconductor device of claim 14 wherein the via extends to the outer surfaces of both the device and the cover die.

* * * * *